United States Patent [19]

Nagafuji et al.

[11] Patent Number: 5,283,713
[45] Date of Patent: Feb. 1, 1994

[54] INJECTOR/EJECTOR SYSTEM FOR A PLUG-IN MODULE AND APPARATUS USING THE SYSTEMS

[75] Inventors: Toshiaki Nagafuji; Makoto Kuwahara, both of Tokyo; Kenichi Hatakeyama; Yuji Sato, both of Iwate, all of Japan

[73] Assignee: NEC Corporation, Tokyo, Japan

[21] Appl. No.: 944,878

[22] Filed: Sep. 14, 1992

[30] Foreign Application Priority Data

Sep. 20, 1991 [JP] Japan ................ 3-240674
Feb. 28, 1992 [JP] Japan ................ 4-042693

[51] Int. Cl.5 .............. H05K 5/02; B25G 3/18; H01R 13/62
[52] U.S. Cl. .................... 361/796; 211/41; 361/752; 403/328; 439/152; 439/157
[58] Field of Search ............ 211/41; 361/394, 399, 361/412, 413, 415; 403/326, 328, 230; 439/152, 157, 160

[56] References Cited

U.S. PATENT DOCUMENTS 4,740,164 4/1988 Schuliz et al. .............. 439/157

FOREIGN PATENT DOCUMENTS 0479517 4/1992 European Pat. Off. ............ 439/160
0493214 7/1992 European Pat. Off. ............ 361/415
3409021 9/1985 Fed. Rep. of Germany ...... 361/415
0252720 12/1987 Fed. Rep. of Germany ...... 361/415
3818677 12/1989 Fed. Rep. of Germany ...... 361/415
3-230600 10/1991 Japan ................................. 361/415

Primary Examiner—Leo P. Picard
Assistant Examiner—Donald A. Sparks
Attorney, Agent, or Firm—Laff, Whitesel, Conte & Saret

[57] ABSTRACT

The grip of a plug-in module according to the present invention is rotatably supported on the upper side of a circuit board. A first end portion of the grip includes a convex portion which engages with a recessed portion in the housing to prevent the plug-in module from being dislodged from the housing by vibrations or the like. When the first and second engaging end are disengaged and the grip is rotated, a protruding end on one side of the grip abuts and applies pressure to the upper end of the housing to assist in removing the plug-in module from the housing. In addition, the above-described protruding end and an additional protruding end on the other side of the grip may be grasped by a robot to allow insertion or removal of the plug-in module by a robot.

12 Claims, 18 Drawing Sheets

INJECTOR/EJECTOR SYSTEM FOR A PLUG-IN MODULE AND APPARATUS USING THE SYSTEMS

BACKGROUND OF THE INVENTION

1. Field of the Invention

The present invention relates to an injector/ejector system for a plug-in module for inserting into or removing from a cabinet housing a plug-in module such as for a circuit board on which electric parts are loaded.

2. Description of the Related Art

Normally, there are various electric parts and circuit boards packaged on a control panel or the like of an apparatus. With the miniaturization of the electric parts, the number of electric parts packaged on the circuit board has increased. In particular, almost all signal processing circuits other than the power supply circuit are now packaged on a single circuit board. Further, these circuit boards are arranged as plug-in modules which may be inserted into or removed from any one of various positions within the control panel. Injector/ejector systems have been devised in order to allow such flexible injection and ejection to allow easier more efficient maintenance and service in the event of a breakdown and so forth of the control panel.

FIG. 1 is a lateral view illustrating a specific environment of a conventional injector/ejector system, in which a plug-in module 210 comprises a circuit board 217, a T-shaped grip made of plastic or the like which is fixed on the upper side of the circuit board 217 by means of fixed pins 212, and a connector 218 fixed on the lower side of the circuit board 217. The housing 230 into or from which the plug-in module 210 is inserted or removed comprises guide portions 234a, 234b for guiding both lateral sides of the plug-in module 210 when the plug-in module 210 is being inserted or removed, a plug 238 for connection with the connecter 218 and a base plate 239 to which the lateral plates 231, 232 and the plug 238 are fixed.

Although the plug-in module 210 may be manually inserted into or removed from the housing 230, protruding portions 211a, 211b are provided on the grip 211 to allow grasping by a robot, and the assembly operation may therefore be performed by the robot. The robot grasps the plug-in module 210 by engaging opposing engaging holes 223a, 224a provided on the fingers 223, 224 of the robot hand 220 with the protruding portions 211a, 211b and then horizontally shifting the fingers 223, 224 in the direction indicated by the arrows P, Q. The robot then vertically moves the hand 220 while grasping the plug-in module 210 in order to inject and eject the plug-in module 210.

However, the foregoing conventional injector/ejector system has the following drawbacks. When manually removing the plug-in module, it is difficult to get a secure grip on module because the limited space between adjacent plug-in modules 210 does not afford space for fingers. Since there is no mechanism for locking the plug-in module 210 within the housing 230, the plug-in module 210 can be easily dislodged from the housing 230 due to vibration or the like. When the plug-in module is being manually inserted or removed, static electricity accumulated in the human body may result in electrostatic damage to the circuit board or LSI mounted on the circuit board through contact by fingers with the conductor paths of the circuit board. Further, depending on the type of the circuit board of the plug-in module, it may be necessary to shield it to prevent leakage of magnetic waves from the circuit board to the outside, and it is difficult to shield the entire surface of a conventional grip without complicating insertion or removal of the circuit board.

Further, U.S. Pat. No. 4,996,631 discloses an injector/ejector system for mounting plug-in modules in a cage with front panels. However the system is not applicable to insertion or removal by a robot. The system cannot be locked with a elastic element and the lever handle is not electrically conductive. Therefore, this system does not provide solutions to the aforementioned drawbacks.

SUMMARY OF THE INVENTION

Accordingly, an object of the present invention is to provide an injector/ejector system for a plug-in module which allows relatively effortless insertion or removal of the plug-in module but which will not allow dislodging of the module due to vibration.

Another object of the present invention is to provide an injector/ejector system which allows relatively effortless insertion and removal of the plug-in module while minimizing the potential of damage to the electrical parts by static electricity.

A further object of the present invention is to provide an injector/ejector system for a plug-in module which allows relatively effortless insertion or removal of the plug-in module which does not dislodging due to vibration and which also allows easy handling of the plug-in module by a robot.

A still further object of the present invention is to provide an injector/ejector system which has the foregoing advantages and also allows shielding of the plug-in module.

The above and other objects, features and advantages of the present invention will become apparent from the following description referring to the accompanying drawings which illustrate examples of a preferred embodiment of the present invention.

In order to achieve the above-mentioned objects, the injector/ejector system for a plug-in module of the present invention comprises a plug-in module and a housing.

The plug-in module comprises a circuit board with electrical components mounted on at least one rectangular surface and surrounded by four sides, a grip for insertion and removal of the circuit board mounted on a first side of the plug-in module, second and third sides adjacent to the first side aligned parallel to each other and arranged to allow sliding, and a first connector for electrical connection mounted on any one side other than the first side.

The housing comprises a guide means for guiding the second and third sides of the plug-in module when the fourth side of the plug-in module is inserted into the insertion space of the housing such that the plug-in module may slide to a predefined position and allow electrical connection between a second connector in the housing and the first connector on the plug-in module.

The grip of the plug-in module has a first end portion and a second end portion, the first end portion having a first engaging end formed in such a manner that it may be deformed by pressure, and the grip is attached to the circuit board by means of a shaft or a pin at a predefined position between the first and second end portions so that it may be rotated in a plane parallel to the surface of the plug-in module.

The first engaging end of the first end portion exerts a resilient force against a second engaging end provided in the housing when the plug-in module is inserted into the housing to the predefined position and engages with the second engaging end i the housing, and the first engaging end can also be disengaged from the second engaging end when pressure is exerted against the first end portion.

The second end portion has a protruding tab that is provided to allow removal of the plug-in module by robot, the protruding tab being separated from the insertion side of the housing which lies adjacent to the second end portion when the plug-in module is fully inserted into the housing. In addition, when the first and second engaging ends are disengaged and the first end portion is rotated away from the first side of the circuit board of the plug-in module, the protruding tab of the second end portion also rotates and abuts an insertion end of the housing, thereby exerting a force against the housing to facilitate removal of the plug-in module as the grip is further rotated.

According to one modification of this invention, the first end portion has a protruding tab for gripping by a robot. The protruding tab is separated from the insertion end of the housing which lies adjacent to the first end portion when the plug-in module is fully inserted into the housing and the first and second end portions engage.

The circuit board may be a printed circuit board on which electrical parts are mounted and the grip is made of a plastic material covered with an electrically conductive layer.

The grip of the plug-in module comprises a first end portion made of a resilient metallic plate and another portion made of a plastic member which is covered with an electrically conductive layer.

In another modification of this invention, the grip of the plug-in module comprises plastic members which sandwich a resilient metallic plate that extends parallel to the first side of the circuit board of the plug-in module between the first and second end portions, the first end portion of the metallic plate protruding from between the plastic embers to form the first end portion.

In this modification, the grip of the plug-in module has a T-shaped end with protrusions separated from the face of the first side of the plug-in module to allow gripping by a robot when the first and second engaging portions are engaged. The resilient metallic plate extends across the full width of the grip at a right angle to the direction between the first and second end portions.

Further, the electronic apparatus of the present invention allows a plurality of the injector/ejector systems described above to be installed parallel and adjacent to each other in a housing.

DETAILED DESCRIPTION OF THE PREFERRED EMBODIMENTS

Figure 2:
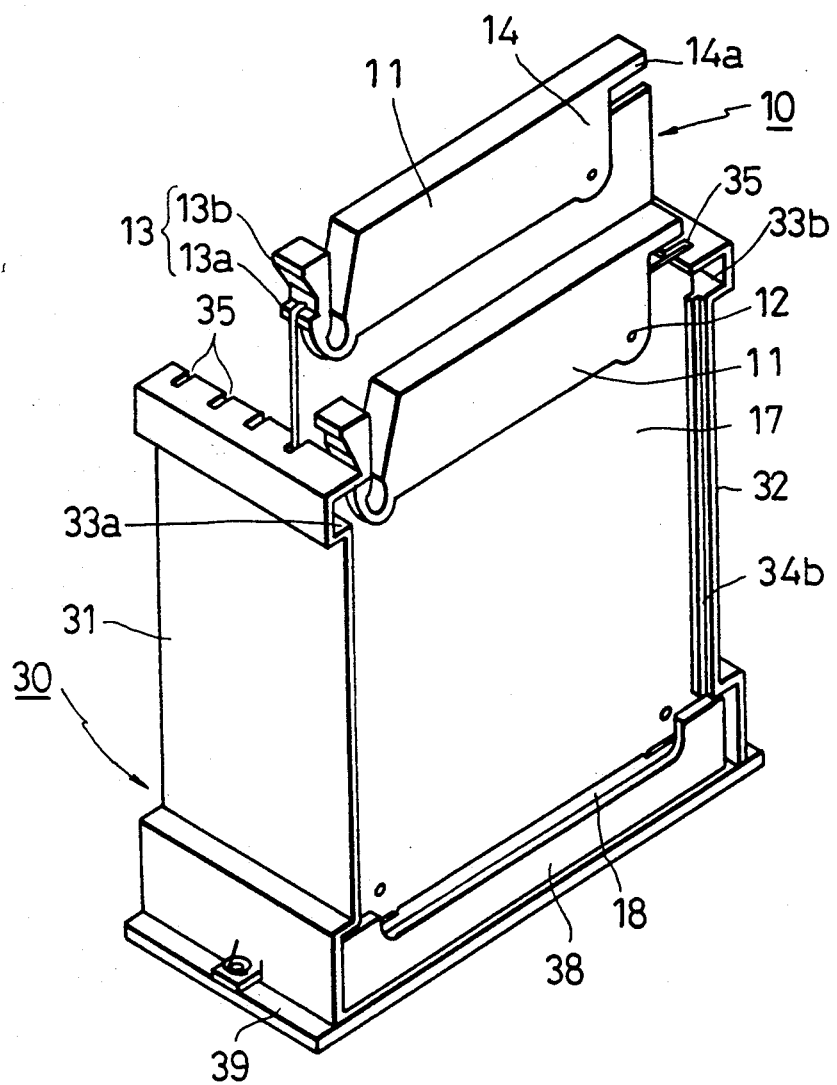
FIG. 2 is a perspective view illustrating a first embodiment of the injector/ejector system for a plug-in module according to the present invention.

As is apparent from FIG. 2, the injector/ejector system for the plug-in module according to the present invention comprises a plug-in module 10 and a housing 30 in a cabinet form into which the plug-in module 10 is inserted. The plug-in module 10 comprises a circuit board 17 (a printed circuit board or the like) on a surface or surfaces of which a multiplicity of electronic parts such as LSIs are loaded, a grip 11 is rotatably mounted on its upper side by means of a rotating shaft 12, and a first connector 18 (male connector) is mounted on its lower side. In this embodiment, a plurality of plug-in modules 10 can be fitted within the housing 30. The housing 30 comprises a lateral plates 31, 32 provided with guide channels 35 for guiding the two lateral sides of the circuit board 17 of the plug-in module 10 when the plug-in module 10 is inserted into the housing 30, a second connector 38 (female connector) for connection with the first connector 18, and a base plate 39 on which the lateral plates 31, 32 and second connector 38 are mounted.

In FIG. 2, the connectors 18, 38 are shown to connect at the bottom of the housing 30, but they may also be arranged to connect at the side of the housing 30. Incidentally, a recess portion 33a as a second engaging end and another recess portion 33b are each provided at the upper end of lateral plates 31, 32.

Figure 3:
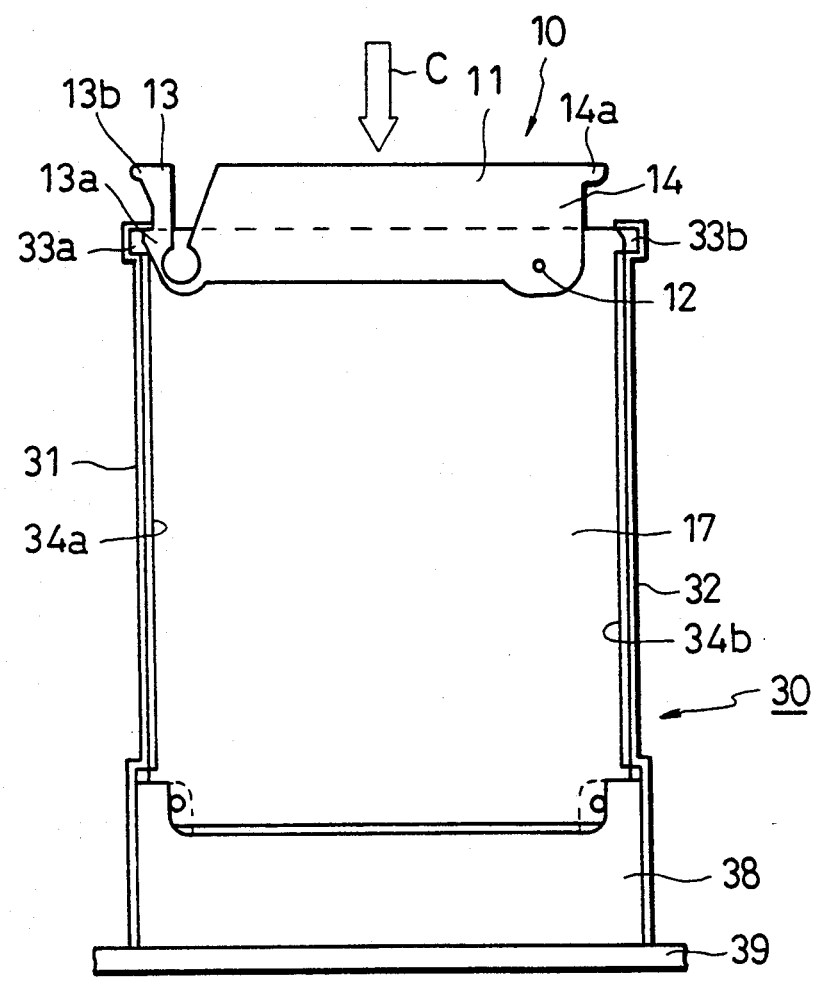
FIG. 3 is a lateral view of the embodiment of FIG. 2 illustrating the state in which the plug-in module is inserted into the housing up to a predefined position and locked.

As can be seen in FIG. 3, the grip 11 is made of plastic to which is applied an electrically conductive coating 2 and which is rotatably supported by a shaft 12 (or a pin) at a position near the right and upper corner of the circuit board 17. In this embodiment, the grip 11 is arranged to rotate clockwise in a plane parallel to a surface of the circuit board 17 from a [locked] position parallel to the upper side of the circuit board 17 to a predetermined angle. The first end portion 13 of the grip 11 at the left of FIG. 3 is substantially U-shaped so as to have elasticity, and its outer edge is provided with an engaging convex portion 13a as a first engaging end and a protruding end 13b for gripping by a robot. At a second end portion 14 opposite to the first end portion 13 of the grip 11, a protruding end 14a (shaped like a tab) is provided to facilitate removal of the module 10. Incidentally, when convex portion 13a is locked, protruding ends 13b and 14a laterally protrude in an outward direction at a position separated from the upper end of the lateral plates 31, 32.

The manual operation of the embodiment shown in FIG. 2 will next be described with reference to FIGS. 3 through 7.

Figure 1:
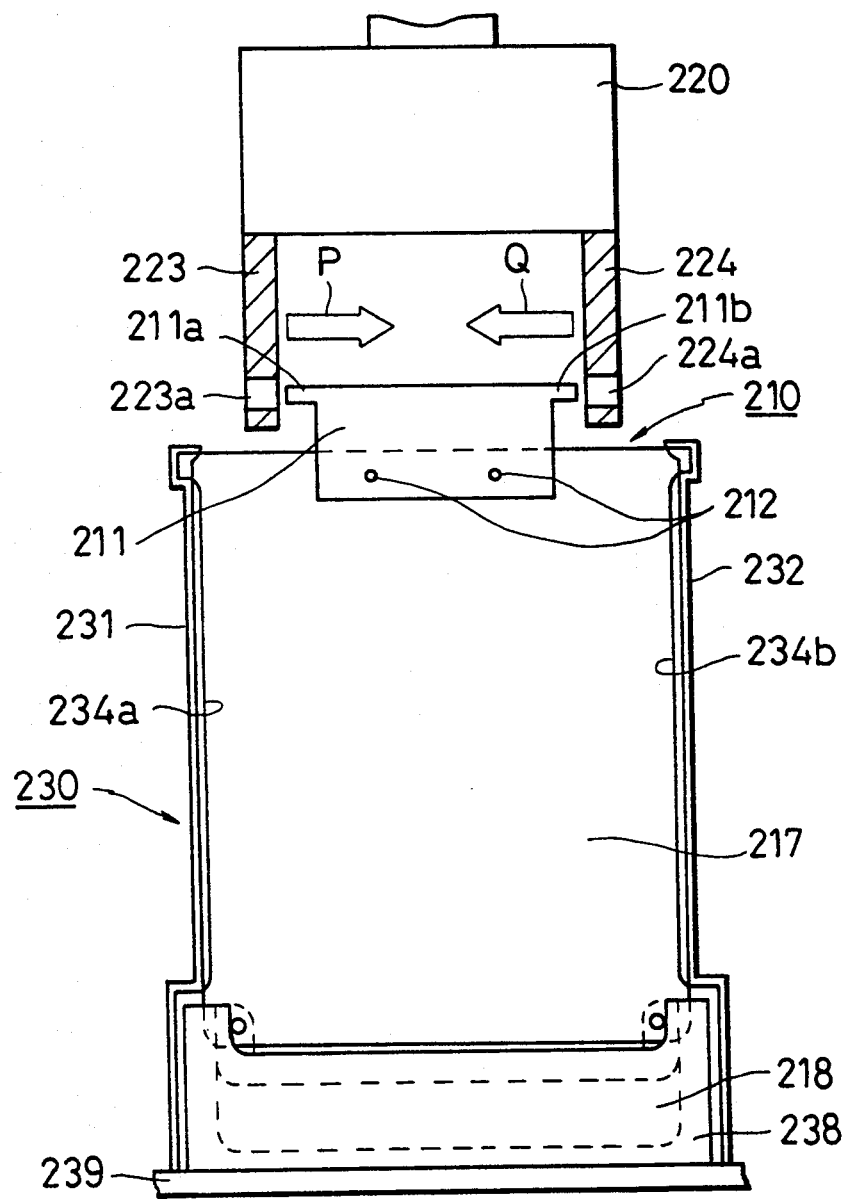
FIG. 1 is a lateral view illustrating a conventional injector/ejector system for a plug-in module.

Referring to FIG. 3, the first end portion 13 is pressed and deformed toward the second end portion 14 while plug-in module 10 is pushed in the direction of arrow C to insert the module 10 into the housing 30 up to the predefined position where the first and second connectors 18, 38 are completely connected. At this time, both sides of the circuit board 17 are aligned with guide channels 35 (in FIG. 1) which are nearly entirely enclosed by guide portions 34a and 34b.

Figure 4:
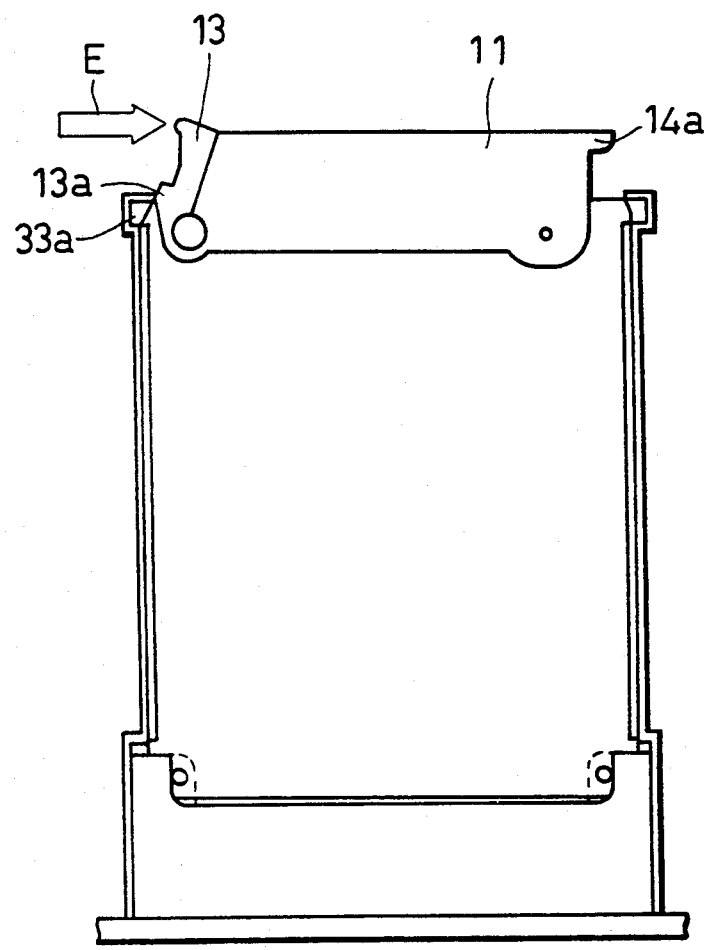
FIGS. 4 through 7 each show how the plug-in module of the embodiment of FIG. 2 is released manually from the housing.

When the plug-in module 10 has been inserted up to the predefined position, the pressure applied to the first end portion 13 is released. When this pressure is released, the spring action of the first end portion 13 causes the convex portion 13a to fit into recess portion 33a at the upper end of the lateral plate 31 to lock in the plug-in module and prevent the module from being pulled out from the housing 25 30. When convex portion 13a is locked into recess 33a as shown in FIG. 3 and pressure is applied in the direction of arrow E shown in FIG. 4 to the first end portion 13, the pressure will depress the first end portion 13 as shown in FIG. 4. If the plug-in module 10 is then rotated in the direction indicated by arrow D in FIG. 5, the convex portion 13a will disengage from the recess portion 33a. Releasing the pressure applied against the first end portion 13 will result in the condition shown in FIG. 5.

Figure 5:
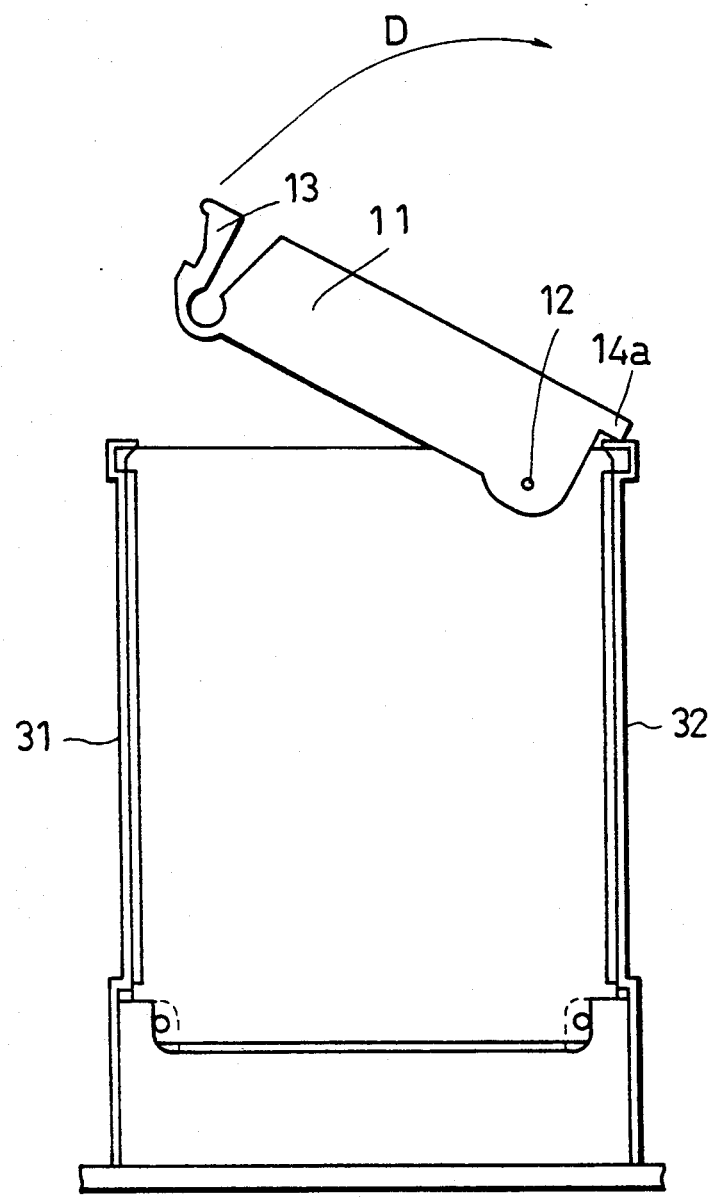
Figure 6:
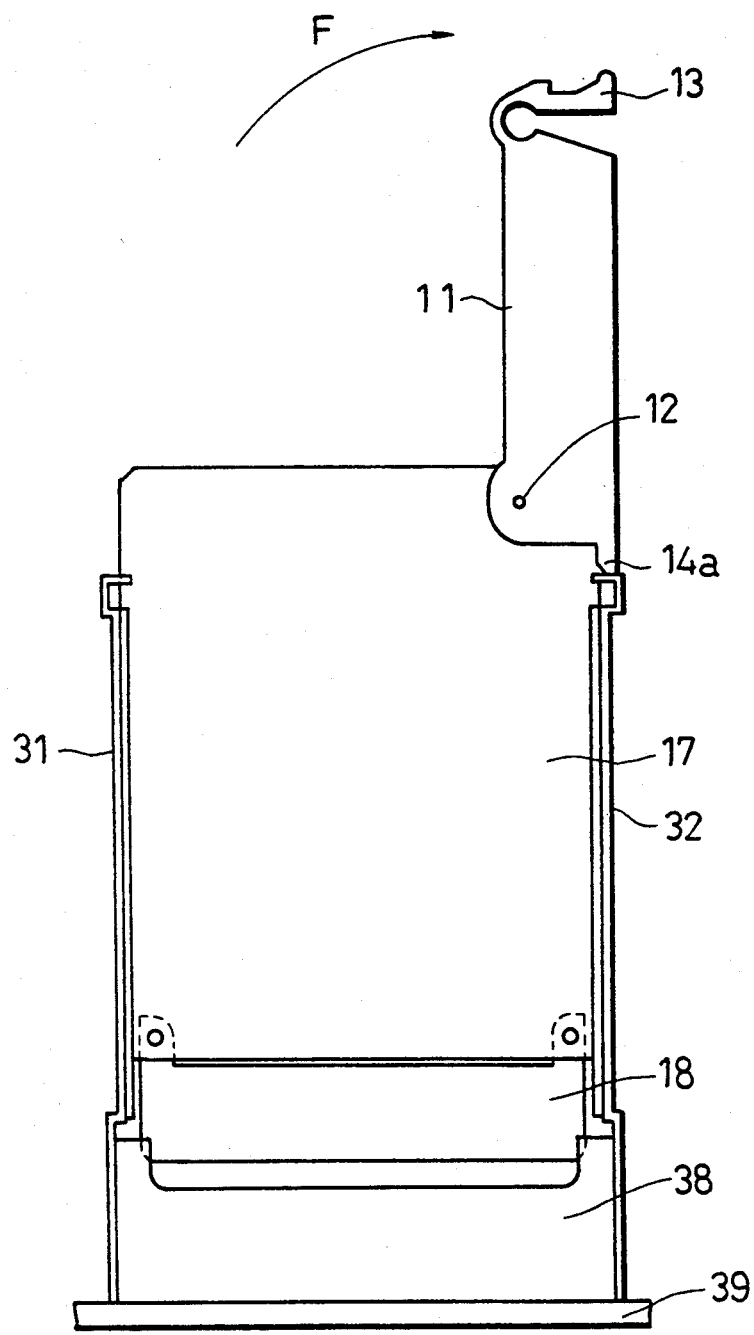
Figure 7:
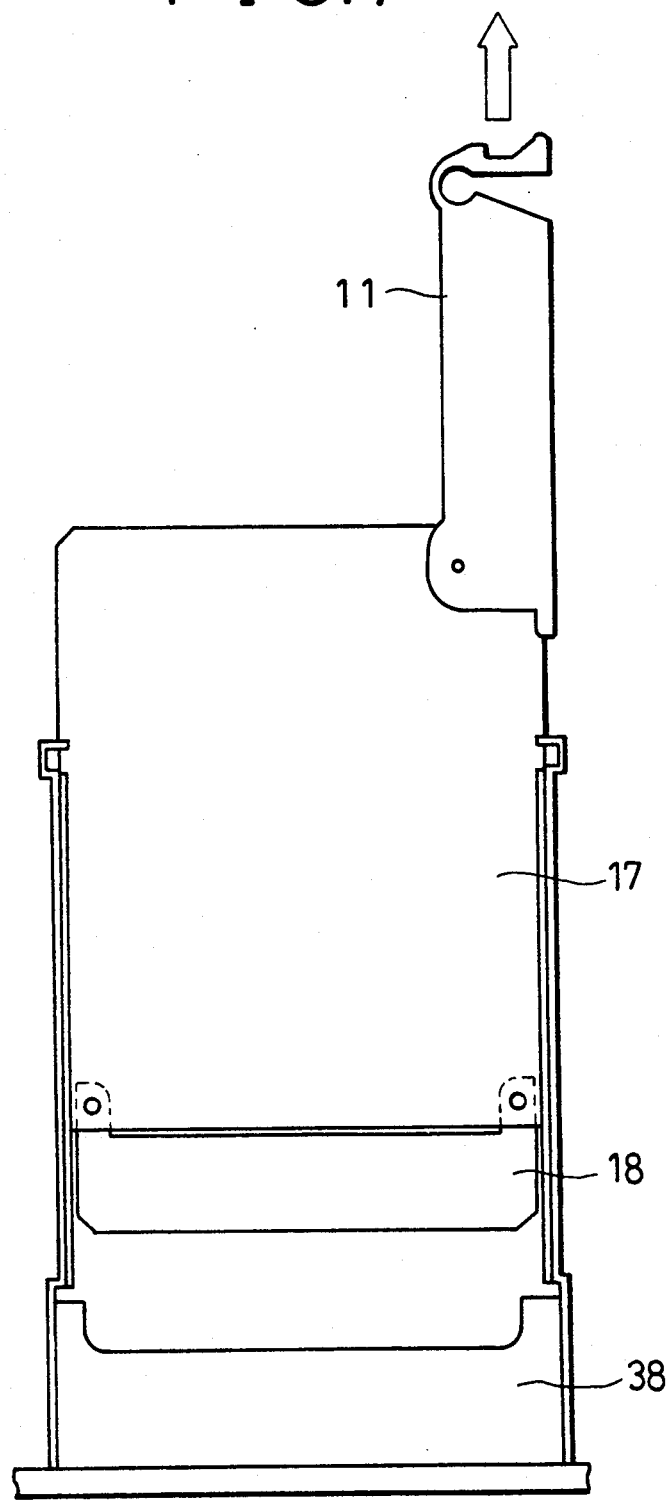
Figure 8:
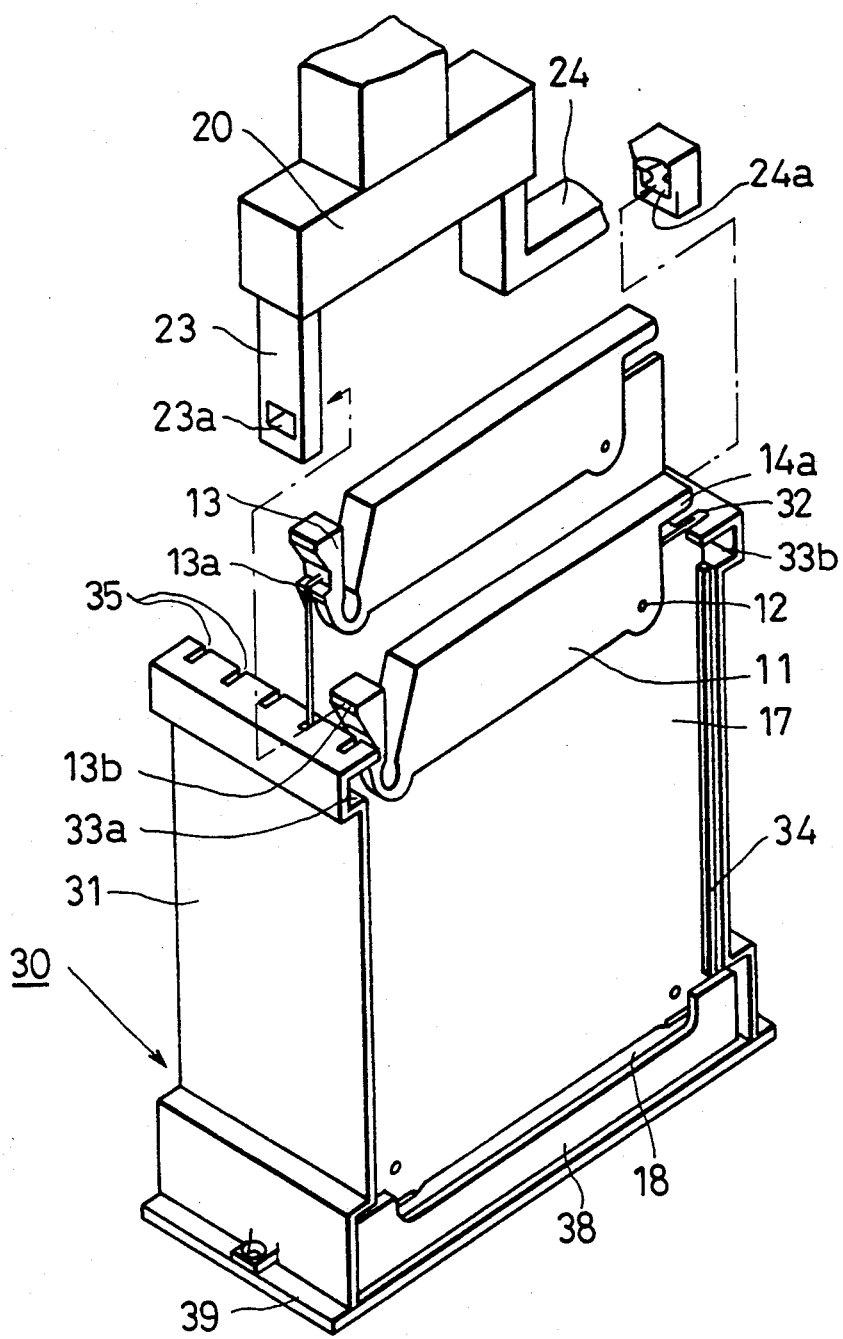
FIGS. 8 through 11 each show how the plug-in module of the embodiment of FIG. 2 is removed from the housing by a robot.

In FIG. 5, protruding portion 14a of the second end portion 14 abuts the upper end of lateral plate 32. If the grip 11 is further rotated in the direction indicated by arrow F as indicated by FIG. 6, the plug-in module 10 will be partially ejected from the housing 30, and the first and second connectors 18, 38 will also be disconnected. As indicated in FIG. 7, the removal of the plug-in module 10 may then be completed by simply pulling it out of the housing 30. In a modification different from the system as shown in FIG. 6, the first connector 18 may be partially removed from the second connector 38 to an extent to sufficiently weaken the connecting force without completely separating the two connectors 18, 38.

The removal of the plug-in module 10 by a robot will next be described with reference to FIGS. 8 through 11.

Figure 9:
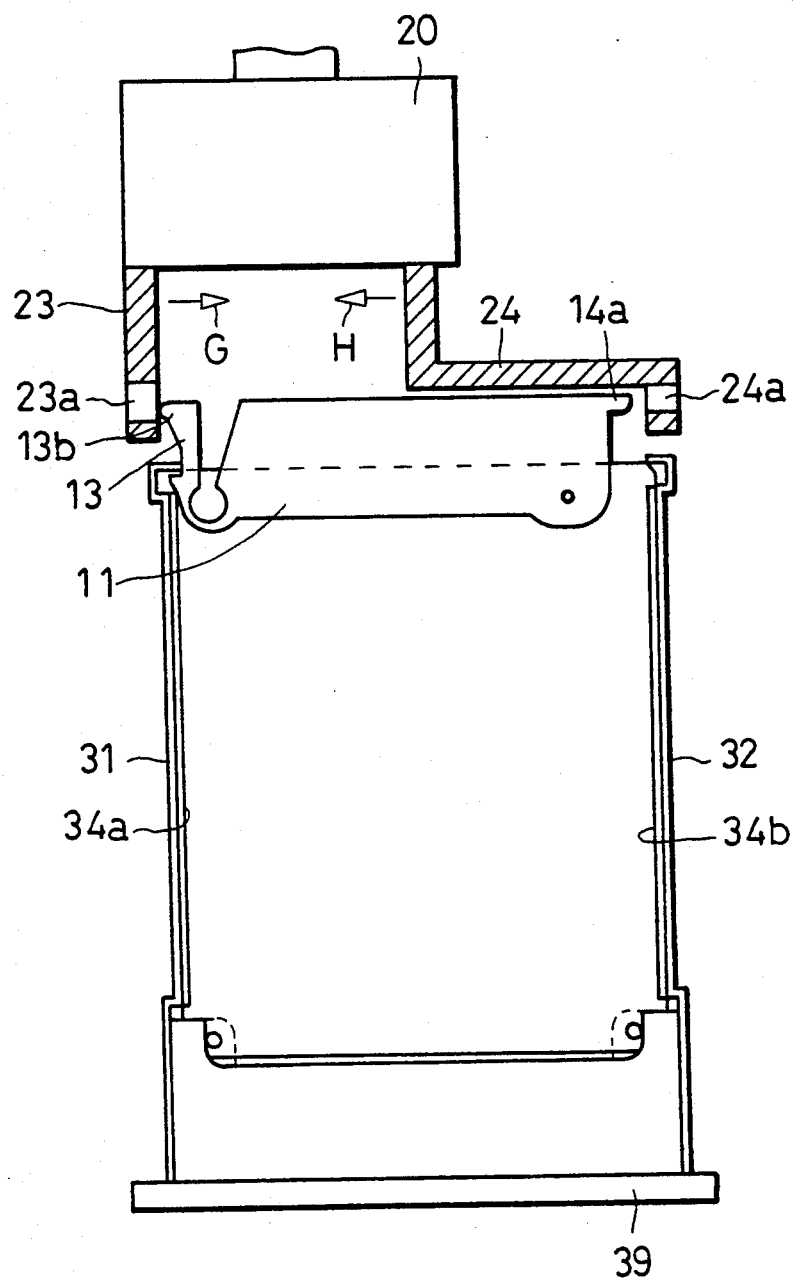
Figure 10:
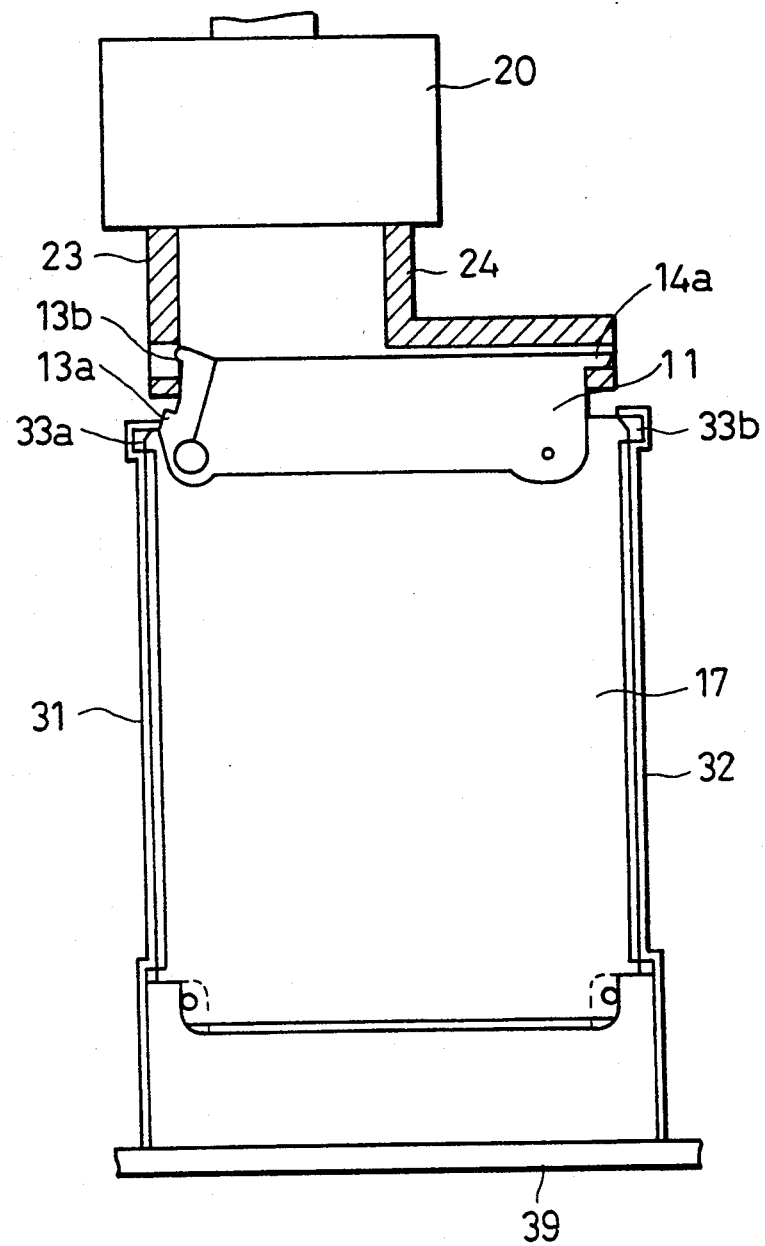
Figure 11:
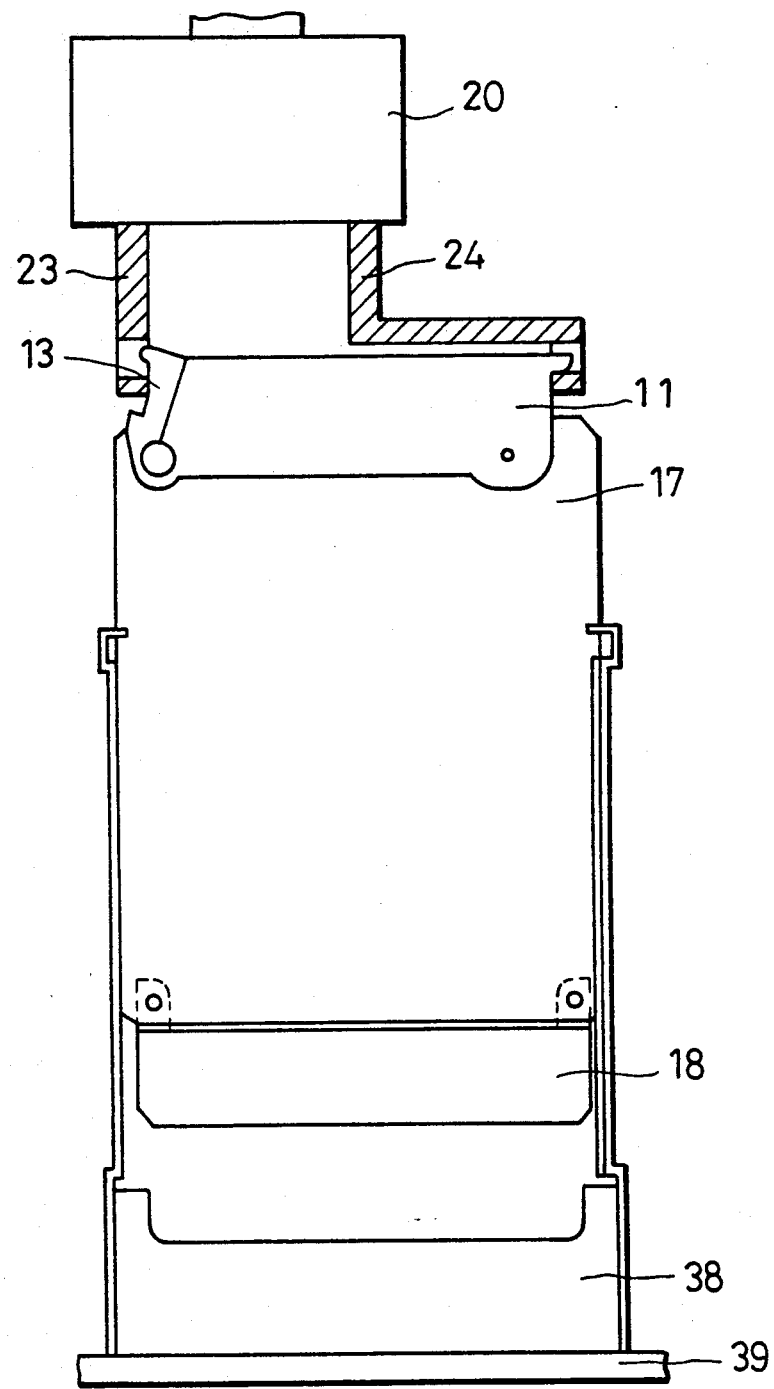

The hand 20 of the robot has first and second fingers 23, 24, each being movable in the horizontal direction. The first and second fingers 23, 24 each have an engaging hole 23a, 24a which can engage the protruding ends 13b, 14a, respectively, of the grip 11 of the plug-in module. The robot spreads the fingers 23, 24 as shown in FIG. 9 (a sectional view of the fingers 23, 24 is shown in FIG. 9), and moves the hand 20 to a position where engaging holes 23a, 24a are aligned with the protruding ends 13b, 14a. The fingers 23, 24 then move in the direction indicated by arrows G and H, resulting in the state shown in FIG. 10 in which the holes 23a, 24a are each engaged with protruding ends 13b, 14a and the first end portion 13 is deformed sufficiently to disengage the convex portion 13a from the recess portion 33a. As shown in FIG. 11, the robot then pulls the plug-in module 10 from the housing 30 by moving back the hand 20.

Figure 12:
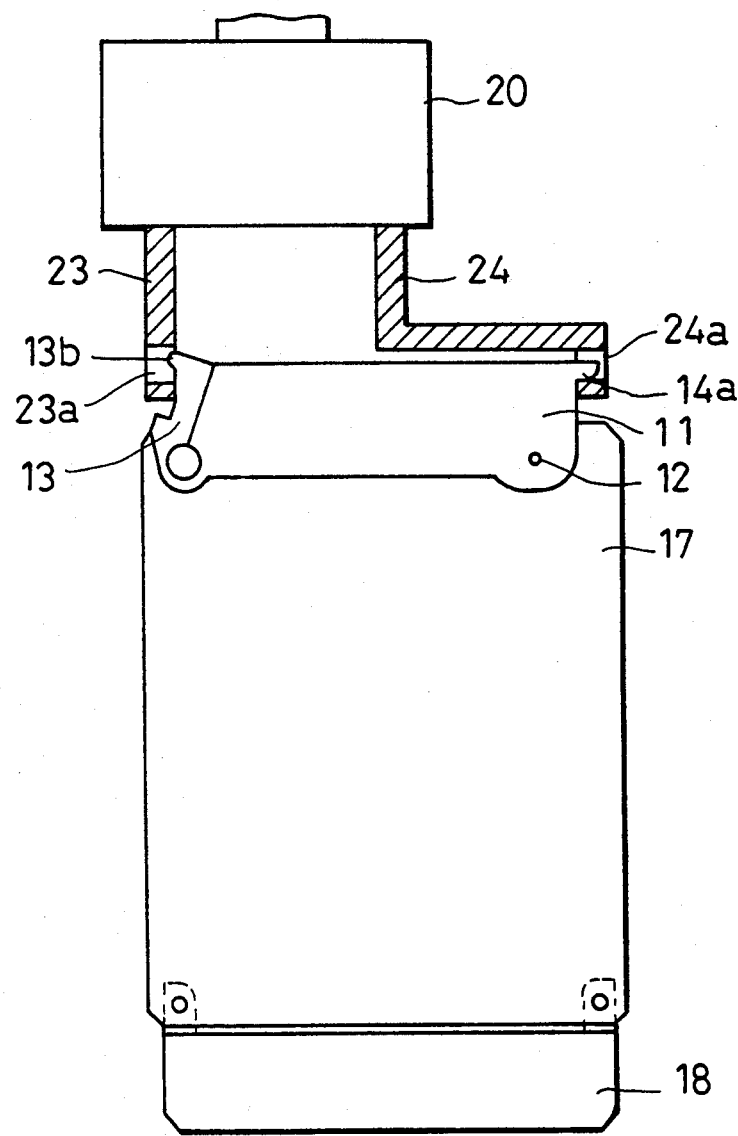
FIGS. 12 through 15 each show how the plug-in module of the embodiment of FIG. 2 is inserted into the housing by a robot.
Figure 13:
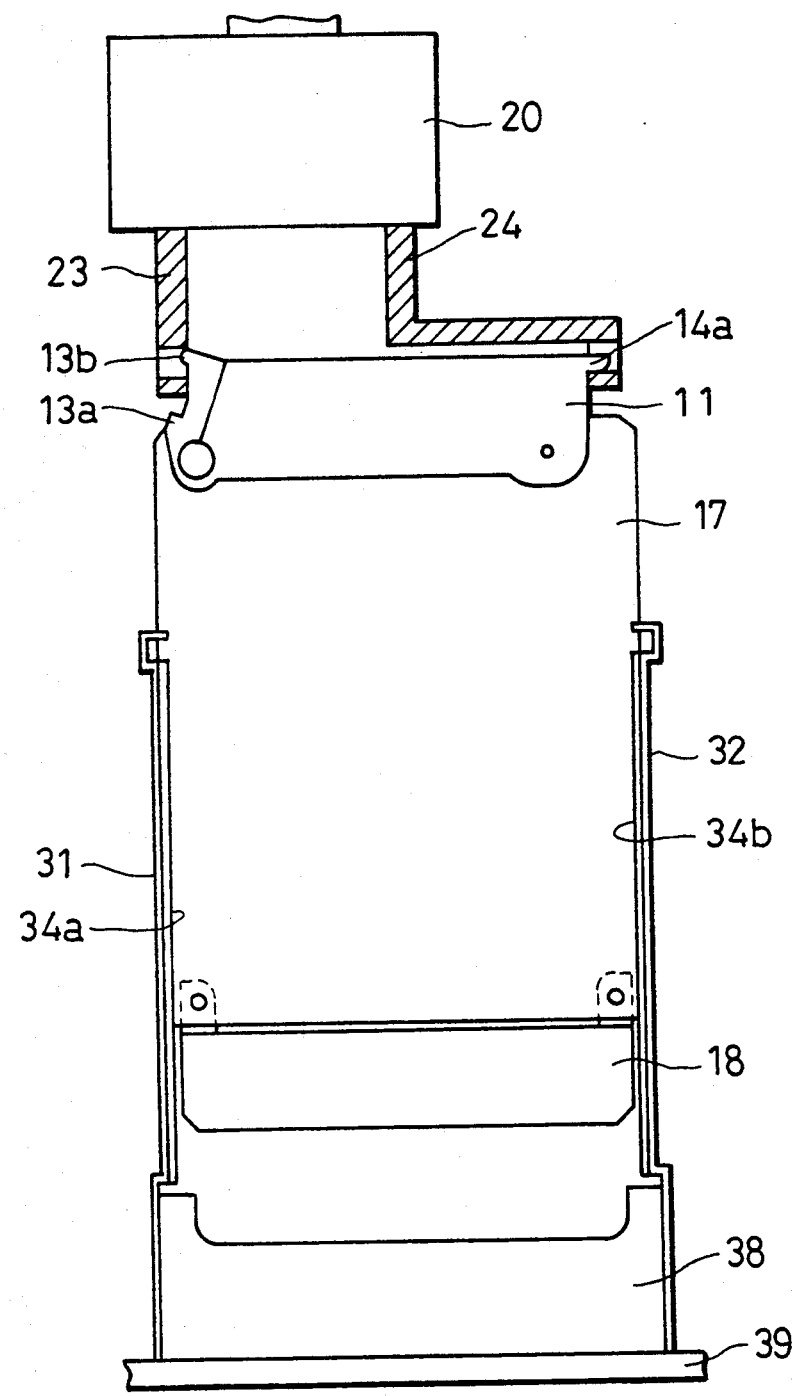
Figure 14:
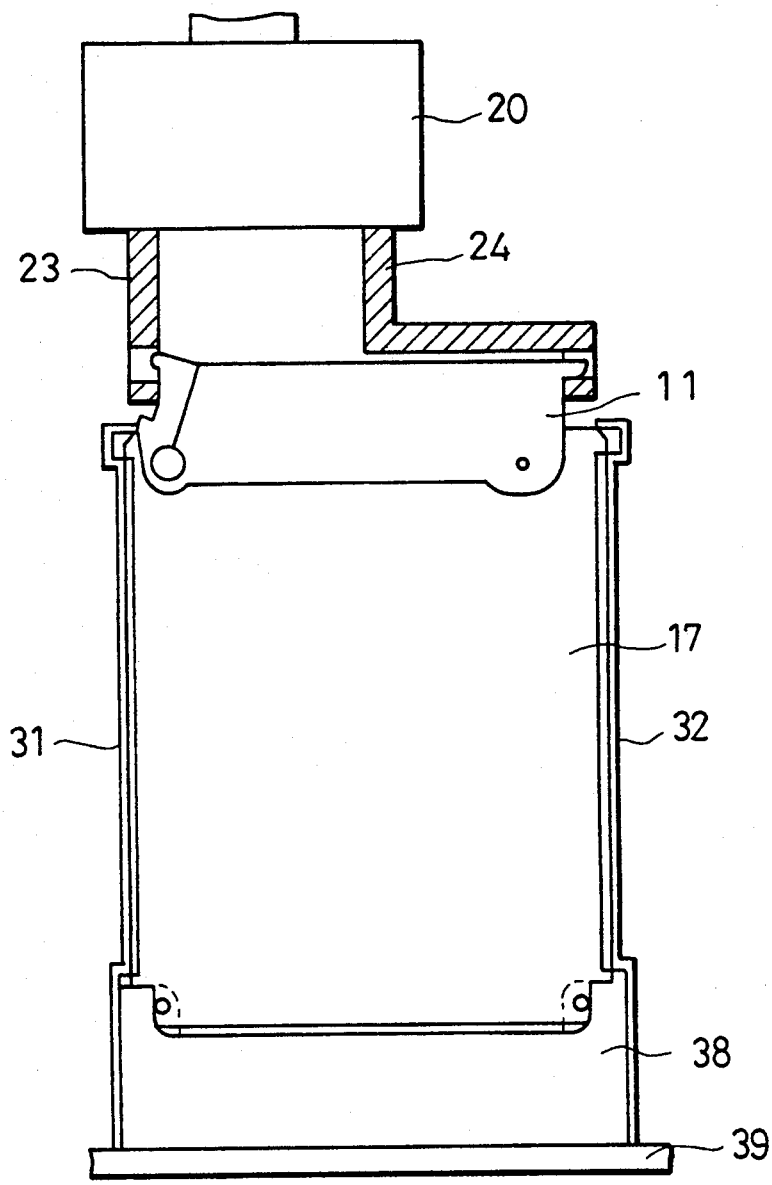

The manner in which a robot inserts the plug-in module 10 into the housing will now be described with reference to FIGS. 12 through 15. The robot grips the plug-in module with its fingers 23, 24 as shown in FIG. 12. The gripped plug-in module 10 is inserted into the housing 30 as shown in FIG. 13. Both lateral sides of the circuit board 17 of the plug-in module slide along the guide channels, and the module is inserted up to the predefined position at which the first and second connectors 18, 38 are completely connected (FIG. 14).

Figure 15:
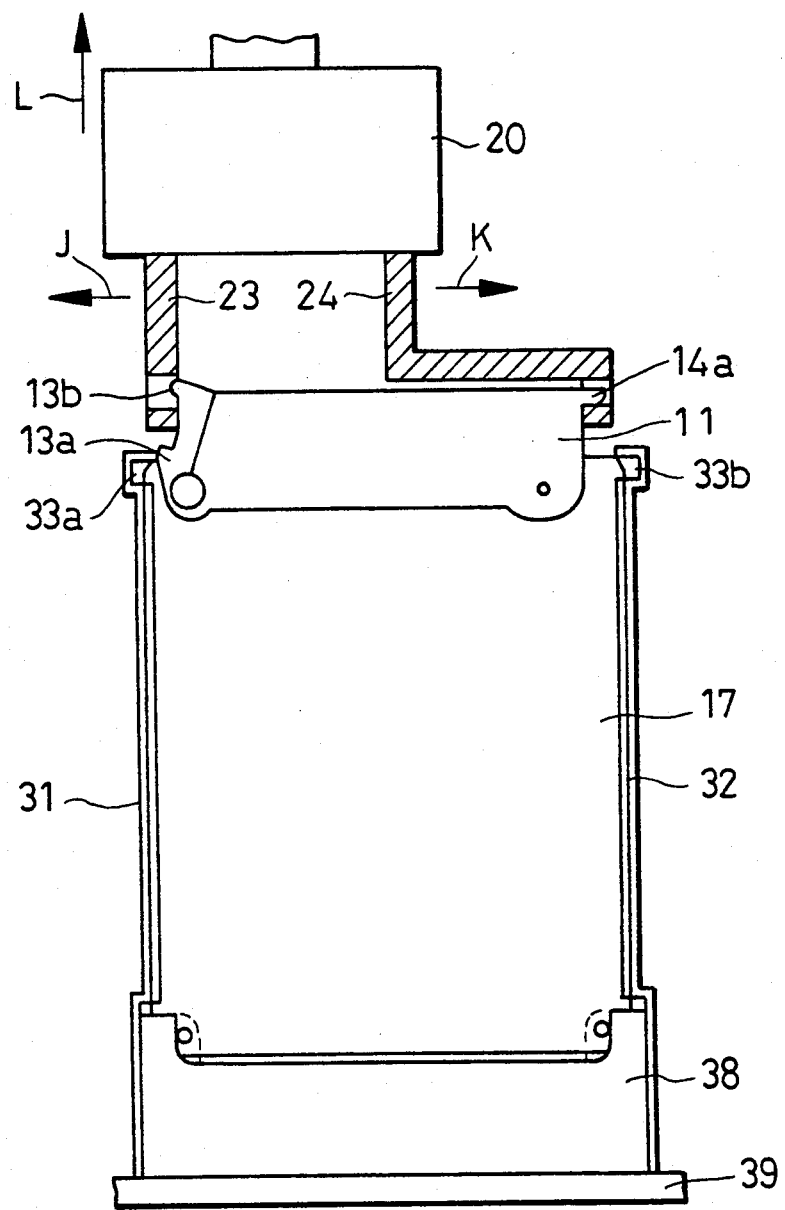

After the circuit board 17 has been inserted, the fingers 23, 24 move in the direction of arrows J and K, respectively, as shown in FIG. 15 and, after the engaging holes 23a, 24a and protruding ends 13b, 14a are disengaged, the hand 20 moves back in the direction of arrow L.

Figure 16:
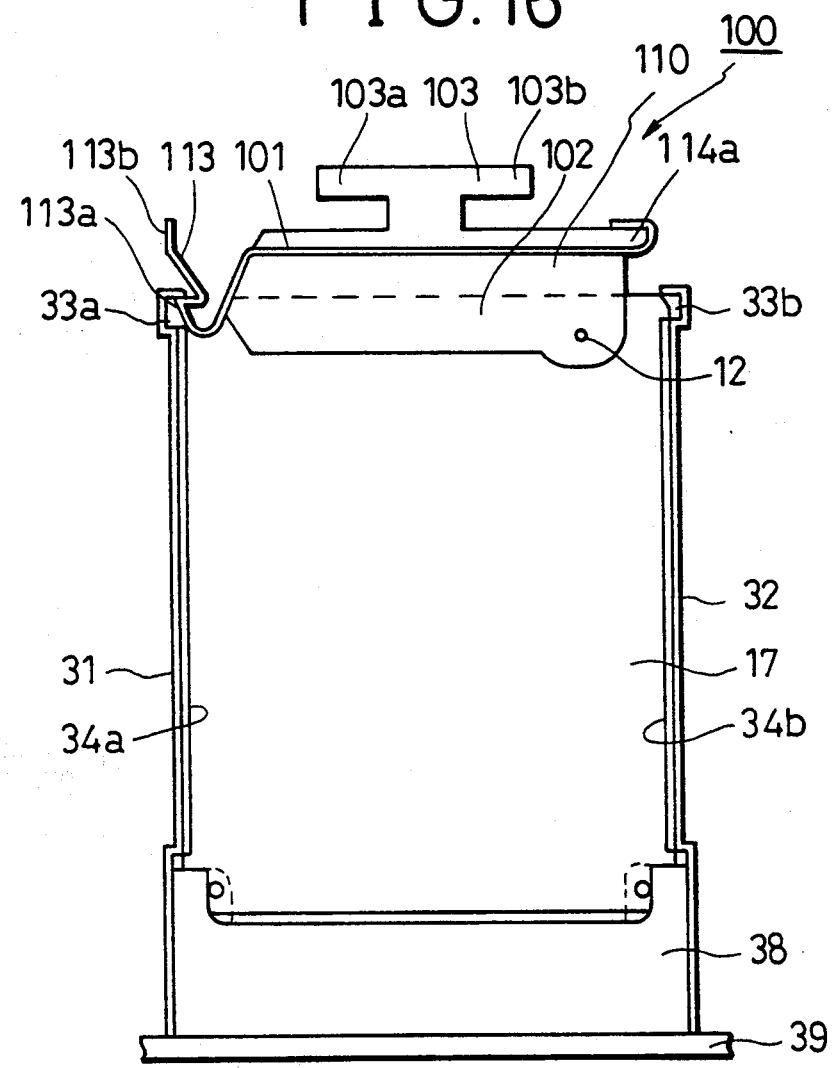
FIG. 16 is a lateral view illustrating a second embodiment according to the present invention.

Another embodiment of the present invention will now be described with reference to FIGS. 16 through 18. As shown in FIG. 16, a grip 110 of a plug-in module 100 in this embodiment comprises a shield plate 101, a plastic base 102, and a T-shaped robot grip portion 103. The shield plate 101 is made of resilient metal and is sandwiched between the base 102 and the grip portion 103. At the first end portion 113, the shield plate 101 protrudes from the base 102 and the robot grip portion 103 to form a convex portion 113a which may engage the recess portion 33a, and a hook 113b against which pressure may be applied to release the engagement of the convex portion 113a and the recess portion 33a. At the second end portion 114, the shield plate 101 is wound about the protruding end 114a. In addition, the shield plate 101 extends in a direction perpendicular to the grip 110 over its entire width, this feature that improves the shielding effect against electromagnetic disturbance when a plurality of plug-in modules are disposed in the crosswise direction. In other words, this feature is very useful when the system of the present invention are connected parallel each other and the systems emit undesirable magnetic waves. Incidentally, parts identified with the same numbers used in FIG. 1 function in the same manner.

When the plug-in module 100 in the embodiment of FIG. 16 is manually inserted or removed, pressure is applied to the hook 113b to engage or disengage the convex portion 113a and the recess portion 33a. The operation of the protruding end 114a is similar to that of the protruding end 14a of the embodiment of FIG. 2.

Figure 17:
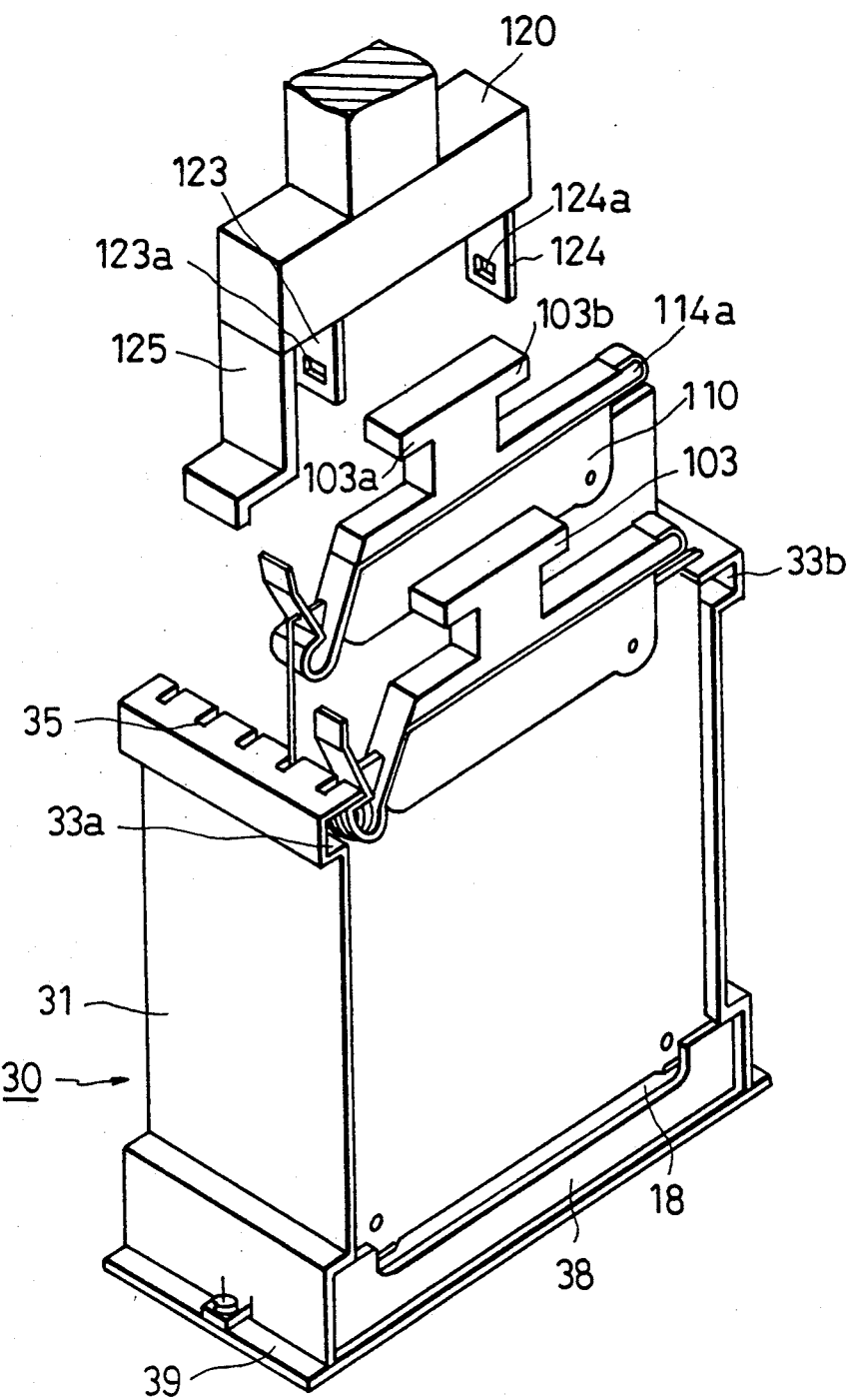
FIG. 17 is a view illustrating how the embodiment of FIG. 16 is inserted and removed by means of a robot.

The insertion or removal of the plug-in module of the embodiment of FIG. 16 by a robot is shown in FIG. 17. The hand 120 of the robot has three fingers 123, 124 and 125. The robot grips the plug-in module 100 by engaging the holes 123a, 124a of its fingers 123, 124 with the protruding ends 103a, 103b of the robot grip portion 103. The robot then engages or disengages convex portion 113a and recess portion 33a by manipulating the hook 113b with its finger 125. In other respects, the insertion or removal operation is similar to that of the previously described embodiment.

Figure 18:
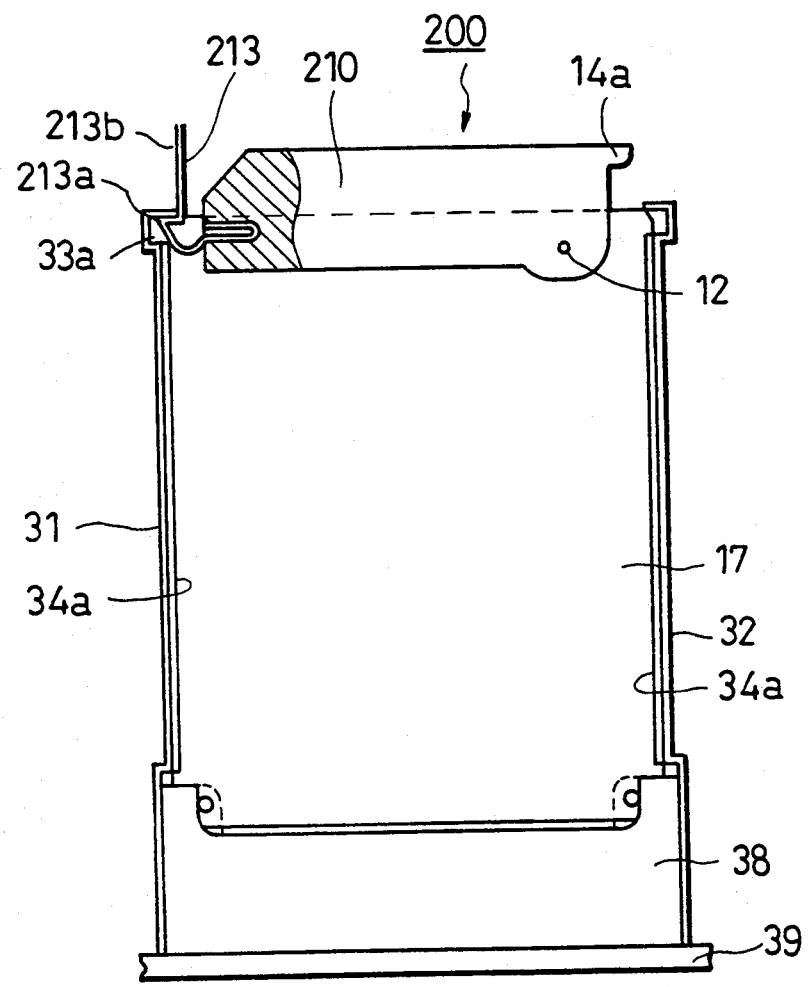
FIG. 18 is a lateral view illustrating a modification of the embodiment of FIG. 16.

FIG. 18 illustrates a modification of the embodiment of FIG. 16 which can be used when neither a shield or manipulation by a robot is required. In this modification, only the first end portion 213 of a grip 210 of a plug-in module 200 is made of a resilient metallic plate, and the convex portion 213a and recess portion 33a are engaged or disengaged by the operation of the hook 213b.

It is to be understood that variations and modifications of the plug-in module disclosed herein will be evident to any person skilled in the art. It is intended that all such modifications and variations be included within the scope of the appended claims.

What is claimed is:

1. A injector/ejector system for a plug-in module comprising a circuit board in which electrical components are mounted on at least one rectangular surface of the circuit board and are surrounded by the four sides, a grip for inserting and removing the module which is mounted on a first side of the circuit board, second and third sides of the circuit board adjacent to the first side and running parallel to each other which are intended to slide, a first connector for electrical connection mounted on any one side of the circuit board other than the first side, and a housing comprising a guide means for guiding the second and third sides of the circuit board of the plug-in module when the fourth side of the circuit board is inserted into the housing such that the plug-in module may slide into the housing up to a predefined position and a second connector that may be electrically connected with the first connector when the plug-in module is inserted to the predefined position;

the grip of the plug-in module having a first end portion and a second end portion, the first end portion having a first engaging end that may be deformed by pressure and which generates a resilient force, the grip being attached to the plug-in module by means of a rotating shaft at a predefined position between the first and second end portions so that the grip may be rotated in a plane parallel to the surface of the circuit board;

the resilient force of the first engaging end of the first end portion exerting pressure so as to allow engagement between the first engaging end and a second engaging end provided in the housing when the plug-in module is inserted into the housing up to the predefined position, while deformation of the first engaging end allowing disengagement between the first end portion and the second engaging end in the housing when pressure is applied against the resilient force of the first end portion;

the second end portion having a protruding portion which is in a position separated from the insertion side of the housing when the first and second engaging ends are engaged, which lies to one side of the second end portion, which abuts the insertion end of the housing when the first and second engaging ends are disengaged and the first end portion is pulled away from the first side of the circuit board, causing the grip to rotate on its shaft, and which applies a force that assists in removing the plug-in module from the housing as the first end portion is further rotated.

2. The injector/ejector system for a plug-in module as set forth in claim 1 wherein the first end portion has a protruding end for gripping by a robot, the protruding end being separated from the insertion side of the housing and lying to one side of the first end portion when the first and second end portions are engaged.

3. The injector/ejector system for a plug-in module as set forth in claim 1 wherein the circuit board is a printed circuit board on which electrical parts are mounted.

4. The injector/ejector system as set forth in claim 1 wherein the grip of the plug-in module comprises a plastic member.

5. The injector/ejector system for a plug-in module as set forth in claim 4 wherein the grip of the plug-in module is covered with an electrically conductive member.

6. The injector/ejector system for a plug-in module as set forth in claim 1 wherein the grip of the plug-in module comprises a first end portion made of a resilient metallic plate and another portion made of a plastic member.

7. The injector/ejector system for a plug-in module as set forth in claim 6 wherein the portion made of a plastic member is covered with an electrically conductive layer.

8. The injector/ejector system for a plug-in module as set forth in claim 1 wherein the grip of the plug-in module comprises plastic members that sandwich the resilient metallic plate extending parallel to the first side of the circuit board between the first and second end portions when they are engaged, the first end portion of the metallic plate protruding from the plastic members to form the first end portion.

9. The injector/ejector system for a plug-in module as set forth in claim 8 wherein the metallic plate protrudes from the plastic members at the second end portion to wind about the protruding portion of the second end portion.

10. The injector/ejector system for a plug-in module as set forth in claim 8 wherein the grip of the plug-in module has a protruding end for gripping by a robot protruding in the form of T away from the first side of the circuit board when the first and second engaging ends are engaged.

11. The injector/ejector system for a plug-in module as set forth in claim 6 wherein the resilient metallic plate extends in the crosswise direction at a right angle to the direction between the first and second end portions over the full width of the grip.

12. A electronic apparatus having a plurality of injector/ejector systems connected parallel to each other wherein each of them is an injector/ejector system claimed in claim 1.

* * * * *